United States Patent
Nagarajan et al.

(10) Patent No.: US 10,141,717 B2
(45) Date of Patent: *Nov. 27, 2018

(54) SMALL FORM FACTOR TRANSMITTING DEVICE

(71) Applicants: INPHI CORPORATION, Santa Clara, CA (US); Luxnet Corporation, Jhongli (TW)

(72) Inventors: Radhakrishnan L. Nagarajan, Santa Clara, CA (US); Peng-Chih Li, Santa Clara, CA (US); Pi-Cheng Law, Jhongli (TW)

(73) Assignees: INPHI CORPORATION, Santa Clara, CA (US); LUXNET CORPORATION, Jhongli (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/855,927

(22) Filed: Dec. 27, 2017

(65) Prior Publication Data

US 2018/0123316 A1 May 3, 2018

Related U.S. Application Data

(63) Continuation of application No. 15/372,524, filed on Dec. 8, 2016, now Pat. No. 9,887,516, which is a (Continued)

(51) Int. Cl.
*H04B 10/50* (2013.01)
*G02B 6/42* (2006.01)
(Continued)

(52) U.S. Cl.
CPC .......... *H01S 5/0612* (2013.01); *G02B 6/4204* (2013.01); *G02B 6/4212* (2013.01);
(Continued)

(58) Field of Classification Search
CPC .. H04B 10/501; G02B 6/4204; G02B 6/4212; G02B 6/4271; G02B 6/4215;
(Continued)

(56) References Cited

U.S. PATENT DOCUMENTS 7,439,449 B1 * 10/2008 Kumar ................. G02B 6/4292
174/254
2005/0213882 A1 * 9/2005 Go ....................... G02B 6/4201
385/37
(Continued)

*Primary Examiner* — Dalzid Singh
(74) *Attorney, Agent, or Firm* — Richard T. Ogawa; Ogawa P.C.

(57) ABSTRACT

A packaged transmitter device includes a base member comprising a planar part mounted with a thermoelectric cooler, a transmitter, and a coupling lens assembly, and an assembling part connected to one side of the planar part. The device further includes a circuit board bended to have a first end region and a second end region being raised to a higher level. The first end region disposed on a top surface of the planar part includes multiple electrical connection patches respectively connected to the thermoelectric and the transmitter. The second end region includes an electrical port for external connection. Additionally, the device includes a cover member disposed over the planar part. Furthermore, the device includes a cylindrical member installed to the assembling part for enclosing an isolator aligned to the coupling lens assembly along its axis and connected to a fiber to couple optical signal from the transmitter to the fiber.

20 Claims, 5 Drawing Sheets

Related U.S. Application Data continuation of application No. 14/745,316, filed on Jun. 19, 2015, now Pat. No. 9,548,817.

(51) Int. Cl.
| | |
|---|---|
| *H01S 5/00* | (2006.01) |
| *H01S 5/022* | (2006.01) |
| *H01S 5/024* | (2006.01) |
| *H01S 5/068* | (2006.01) |
| *H01S 5/06* | (2006.01) |
| *H01S 5/125* | (2006.01) |

(52) U.S. Cl.
CPC .......... *G02B 6/4271* (2013.01); *H01S 5/0064* (2013.01); *H01S 5/0224* (2013.01); *H01S 5/02284* (2013.01); *H01S 5/02288* (2013.01); *H01S 5/02415* (2013.01); *H01S 5/068* (2013.01); *H01S 5/125* (2013.01); *H04B 10/501* (2013.01); *G02B 6/4215* (2013.01); *G02B 6/4287* (2013.01); *G02B 6/4296* (2013.01); *H01S 5/02248* (2013.01); *H01S 5/02438* (2013.01)

(58) Field of Classification Search
CPC ... G02B 6/4287; G02B 6/4296; H01S 5/0612; H01S 5/0064; H01S 5/0224; H01S 5/02248; H01S 5/02438; H01S 5/02284; H01S 5/02288; H01S 5/02415; H01S 5/068; H01S 5/125
USPC .......................................................... 385/89
See application file for complete search history.

(56) References Cited

U.S. PATENT DOCUMENTS

| | | | |
|---|---|---|---|
| 2011/0033192 A1* | 2/2011 | Daiber | G02B 6/4206 398/183 |
| 2012/0128290 A1* | 5/2012 | Han | G02B 6/4206 385/14 |
| 2013/0250980 A1* | 9/2013 | Daiber | H01S 5/0085 372/20 |

* cited by examiner

SMALL FORM FACTOR TRANSMITTING DEVICE

CROSS-REFERENCE TO RELATED APPLICATIONS

This application is a continuation of and claims priority to U.S. application Ser. No. 15/372,524 filed Dec. 8, 2016, which is a continuation and claims priority to U.S. application Ser. No. 14/745,316, filed Jun. 19, 2015 and now is issued as U.S. Pat. No. 9,548,817 on Jan. 17, 2017, commonly assigned and incorporated by reference herein for all purposes.

BACKGROUND OF THE INVENTION

The present disclosure is related to an optical transmitting device. More particularly, the present invention provides an improved 1550 nm DFB laser diode package on a submount sharing the cold side of a built-in thermoelectric cooling module with an assembly of an aspherical optical coupling lens. Processes for assembling the optical transmitting device are also disclosed.

As science and technology are updated rapidly, processing speed and capacity of the computer increase correspondingly. The communication transmission or reception using the traditional cable is limited to bandwidth and transmission speed of the traditional cable and mass information transmission required in modern life causes the traditional communication transmission overload. To correspond to such requirement, the optical fiber transmission system replaces the traditional communication transmission system gradually. The optical fiber transmission system does not have similar bandwidth limitations, and also has advantages of higher speed transmission, longer transmission distance, its material is not susceptible to the electromagnetic interference. Therefore, present electronic industry performs research in optical fiber transmission which will become the mainstream in the future. Said optical communication is a technology in that light functions as signal carrier and is transmitted between two nodes via the optical fiber. Field of the optical communication can be divided into optical communication side and electrical communication side according to the transmission medium. By the optical transceiver, the received optical signal can be converted to an electrical signal capable of being processed by an IC, or the processed electrical signal can be converted to the optical signal to be transmitted via optical fiber. Therefore, objective of communication can be achieved.

Wavelength-division multiplexing (WDM) is a multitask technology of processing multiple optical carrier signals transmitted by the optical fiber, and this technology is applied on the different wavelengths of laser optical signal. Besides, the term "wavelength-division multiplexing" is mostly applied in optical carrier, and frequency-division multiplexing is applied in radio carrier. Moreover, both of wavelength and frequency are in reciprocal relationship, so their concept can be applied to each other.

Wavelength-division multiplexing is implemented by dividing the data channel into multiple wavelengths in the optical fiber to enable mass data transmission in one optical fiber.

The complete wavelength-division multiplexing (WDM) system can be implemented by a wavelength division multiplexer at transmitting end and a wavelength division demultiplexer at receiving end. At present, there are commercial wavelength division multiplexer/demultiplexer which can combine/divide 80 or more channels in the optical fiber communication system, so that the data transmission speed can exceed multiple Tb/s effectively.

In the transmitting module adapted for WDM technology, the connector usually has single light transmitter structure. However, such light transmitter structure can emit optical signal with preset frequency which usually lacks stability and often drifts away from the preset wavelength during environmental temperature changes. Although adding thermoelectric cooler module to the transmitting device is known, an improved package integrating a thermister, a thermoelectric cooler (TEC) module, and a laser diode (LD) chip on a submount sharing a common code side of the TEC module with an aspherical optical coupling lens is still highly desired for enhancing control of operation temperature, wavelength stability, and LD-to-fiber coupling efficiency of emitted light especially in 1310 nm or 1550 nm DWDM channels.

BRIEF SUMMARY OF THE INVENTION

The present disclosure is related to an optical transmitting device. More particularly, the present invention provides an improved package integrating C-band DFB laser diode, thermoelectric cooler (TEC) module, directly to a submount attached to a cold-side of the TEC module together with an assembly of an aspherical optical coupling lens. Processes for assembling the optical transmitting device are also disclosed. In certain embodiments, the invention is applied to multiple optical transmitting devices configured to be assembled in upside-down fashion with a top housing disposed at bottom on PCB of a transceiver with QSFP Small Form Factor (SFF) specification for high bandwidth optical communication, though other applications are possible.

In a specific embodiment, the present invention provides a packaged transmitter device. The packaged transmitter device includes a base member comprising a planar part mounted with a thermoelectric cooler module, a transmitter module, and an optical coupling lens assembly, and an assembling part connected to one side of the planar part. The packaged transmitter device further includes a circuit board bended to have a first end region being disposed on a top surface of the planar part and a second end region being raised to a higher level. The first end region includes multiple electrical connection patches respectively connected to the thermoelectric module and the transmitter module. The second end region includes an electrical port for external connection. Additionally, the packaged transmitter device includes a cover member disposed to a fixed position over the planar part to at least cover the thermoelectric module, the transmitter module, the optical coupling lens assembly, and the first end region of the circuit board. Furthermore, the packaged transmitter device includes a cylindrical member installed to the assembling part for enclosing an isolator aligned to the optical coupling lens assembly along its axial line and connected to an optical fiber to couple optical signal from the transmitter module to the optical fiber.

Therefore, the present disclosure has at least following advantages. First, the optical transmitter package structure provide a compact transmit module that integrates a thermistor chip, a monitor photodiode (MPD) chip, and laser diode (LD) chip on a submount attached to a cold side surface of a thermoelectric cooler module for improving wavelength stability. Secondly, the package structure further disposes an optical coupling lens assembly next to the submount on the same cold side surface of a thermoelectric cooler module so that the distance between the LD chip and the coupling lens can be fixed without being affected by environmental temperature change. The coupling lens is an aspherical lens providing optimal optical coupling of the emitted laser light from the LD chip at a small first distance and better efficiency to focus into an optical core of fiber at a larger second distance. This simplifies calibration process in X-Y plane and Z-axis for optical alignment of the transmitter device with improved coupling efficiency. The transmitter module on the submount and the coupling lens assembly still can be easily detached so that the lens body can be recycled for reuse when the transmitter module is damaged. Thirdly, the transmitter package structure disposes the TEC module in a recessed region of a base member that is conveniently set to form a thermal contact with a lid member as a good heat sink. Fourthly, a bended circuit board associated with the transmitter device allows the transmitter device to be installed in an upside-down fashion when one or more such transmitter devices are assembled in a QSFP SFF package of a photonic transceiver device to facilitate device heat dissipation by utilizing the lid member as a good heat sink.

The present invention achieves these benefits and others in the context of known optical package technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1:
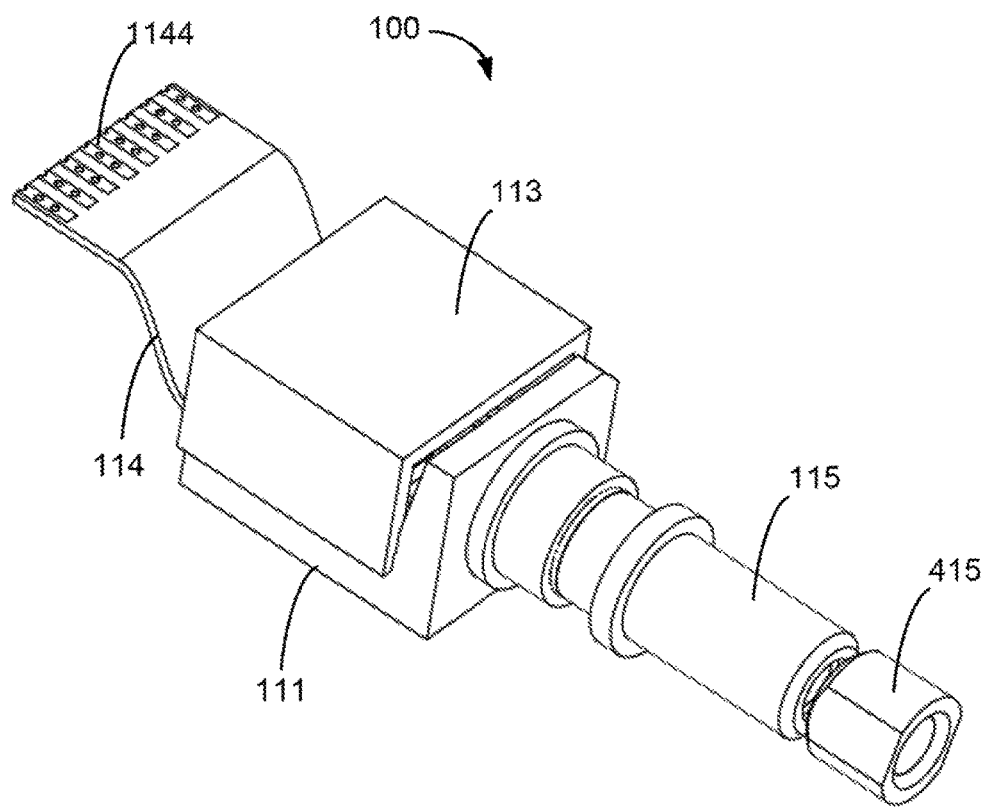
FIG. 1 is a perspective view of a packaged TEC-TOSA transmitter device according to the embodiment of the present invention.

The present disclosure is related to an optical transmitting device. More particularly, the present invention provides an improved package integrating C-band DFB laser diode chip and a built-in thermoelectric cooler (TEC) module directly on a submount sharing a common cold side of the TEC module with an assembly of an aspherical optical coupling lens. Processes for assembling the optical transmitting device are also disclosed. In certain embodiments, the invention is applied for high bandwidth optical communication, though other applications are possible.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

FIG. 1 is a perspective view of a packaged TEC-TOSA transmitter device according to the embodiment of the present invention. This diagram is merely an example, which should not unduly limit the scope of the claims. One of ordinary skill in the art would recognize many variations, alternatives, and modifications. As shown, the packaged TEC-TOSA transmitter device 100 includes a TEC base member 111 for disposing a TEC module, a transmitter module, and an optical coupling lens assembly (not directly visible in FIG. 1) covered by a cover member 113 from above. the packaged TEC-TOSA transmitter device 100 also includes a circuit board 114 curved into a "Z" shape having a first end flat region (not visible in this figure) coupled to the TEC base member 111 and a second end flat region with multiple electrical conduction pin stripes 1144 substantially leveled with the cover member 113 for transmitter device's electrical coupling. More details about those components above will be seen in FIG. 2A below. Additionally, the packaged TEC-TOSA transmitter device 100 includes a cylindrical member 115 having one end being assembled to the TEC base member 111. The TEC base member 111 is made of metal material and can assist the transmitting module to dissipate heat efficiently. The cylindrical member 115 is made for packaging optical coupling elements from a laser diode to an optical fiber. Another end of the cylindrical member 115 is configured to be attached with an optical ferrule holder 415 for fixing an optical fiber therein.

Figure 2A:
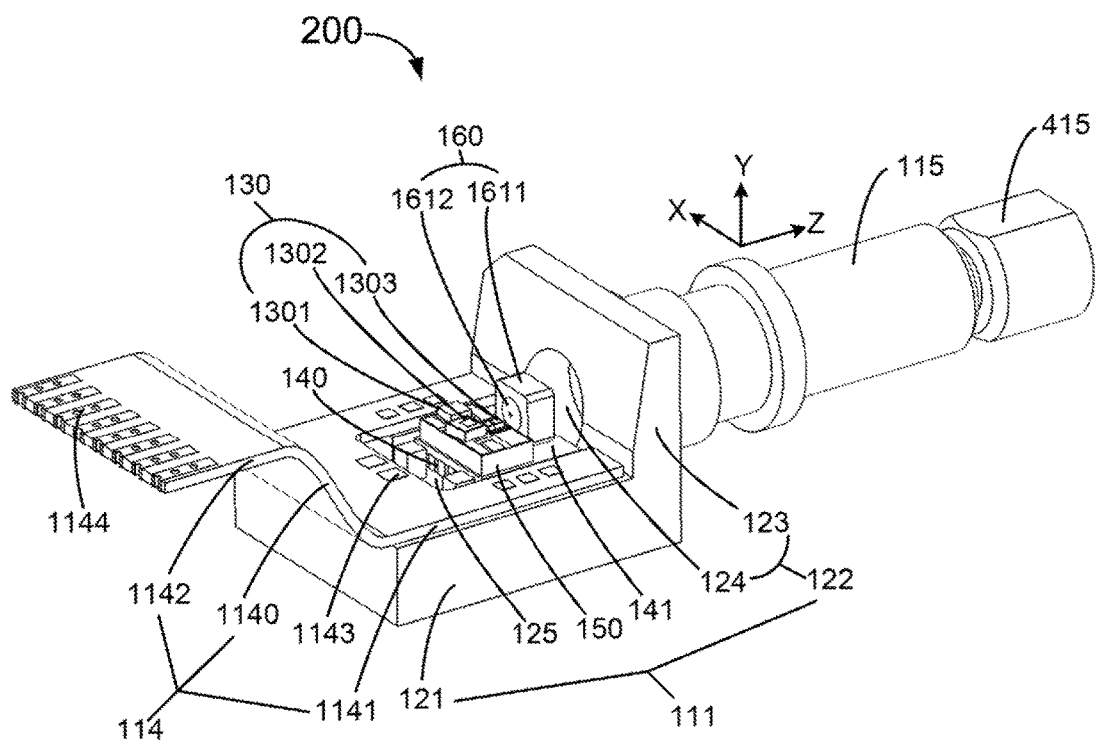
FIG. 2A is a perspective view of the TEC-TOSA transmitter device without a cover member according to the embodiment of the present invention.

FIG. 2A is a perspective view of the TEC-TOSA transmitter device with the cover member removed according to the embodiment of the present invention. This diagram is merely an example, which should not unduly limit the scope of the claims. One of ordinary skill in the art would recognize many variations, alternatives, and modifications. As shown, it is the same TEC-TOSA transmitter device 100 of FIG. 1 with the cover member 113 being removed, revealing some additional elements covered by the cover member 113. Now, the TEC base member 111 is substantially visible with a plane part 121, and an assembling part 122 connected at one end the plane part 121. The plane part 121 includes a semi-hollow region 125 for holding a TEC module 140 which is sandwiched by a cold side 141 (partially visible in FIG. 2A) and a hot side (not visible in FIG. 2A) leveled with bottom surface of the planar part 121. On part of the cold side 141 of the TEC module 140, a submount 150 is disposed and fixed using Ag epoxy. In another embodiment, the submount 150 is configured to mount a transmitter module 130 including a thermistor chip 1301, a monitor photodiode (MPD) chip 1302, and a laser diode (LD) chip 1303 respectively connected through built-in wire connection in the submount 150. Additionally one end of the Step-shaped circuit board 114 is integrated with the planar part 121 of the TEC base member 111 and bended to have other end to be leveled at a different height. This configuration allows an upside-down mounting of the packaged TEC-TOSA transmitter device on the PCB 420.

Referring further to FIG. 2A, the transmitting module 130 comprises a thermistor chip 1301, a MPD chip 1302, a LD chip 1303 of DFB or FP type respectively mounted using either AuSn welding/bonding material or Ag epoxy on corresponding locations of the submount 150. The assembling part 122 of the TEC base member 111 comprises a vertical portion 123 naturally connected to the plane part 121 while configured to allow its opposite side for assembling additional parts, such as the cylindrical member 115. An annular through-hole 124 is disposed in the middle of the vertical portion 123 at least above certain level of the cold side surface 141 of the TEC module 140. In a specific embodiment, an optical coupling lens assembly 160 including a micro glass lens body 1612 held by a square metal frame 1611 is disposed on the flat cold side surface 141 between the submount 150 and the annular through-hole 124, correspondingly to allow the lens body 1612 aligned the LD chip 1303 of the transmitting module 312 for coupling emitted laser light through axial line of annular through-hole 124 into the cylindrical member 115. The coupling lens assembly 160 is fixed by using epoxy to glue the metal frame 1611 directly onto the cold side surface 141 in front of the annular through-hole 124 with a fixed distance between the LD chip 1303 and the lens body 1612. The lens body 1612 comprises an aspherical curved surfaces on both sides having radius of curvature changes according to distance from the optical axis for achieving improved laser light coupling efficiency.

Referring to FIG. 2A again, the Step-shaped circuit board 114 comprises a board body 1140 bended in the middle region with an electrical connection side 1143 disposed on a flat U-shape end 1141 of the board body 1140, and an electrical connection port 1144 disposed on a flat straight end 1142 of the board body 1140, the straight end 1142 is opposite to the U-shape end 1142. As shown, the electrical connection side 1143 of the board body 1140 is fixed on a top surface of the planar part 121 of the TEC base member 111 by gluing via a conductive epoxy. In particular, the electrical connection side 1143 includes multiple conducting patches that are respectively connected via wire bonding to the submount 150, thermistor chip 1301, MPD chip 1302, LD chip 1303, and another submount (not visible) associated with a hot side of the TEC module 140. The electrical connection port 1144 at the straight end 1142 is configured with multiple metallic pin stripes, which are connected to those conducting patches mentioned above via a pre-printed circuit, for external electrical connection. During manufacturing process, after installing the TEC module 140, the submount 150, the transmitter module 130, the coupling lens assembly 160, and the Step-shaped circuit board 114, the cover member 113 (see FIG. 1) will be placed over the planar part 121 from above using press fit or epoxy fixing. Then a filler material is properly selected to seal into any open space over the transmitter module 130 between the cover member 113 and the planar part 121 of the TEC base member 111 by infusion or welding, in order to achieve the objective of sealing the transmitter module 130 as well as the electrical connection side 1143 of the circuit board 114. In another embodiment, the Step-shaped circuit board 114 is configured to have the flat straight end 1142 with electrical connection port 1144 substantially leveled with an outer surface of the disposed cover member 113. In an example of applying the packaged TEC-TOSA transmitter device 100 for assembling a small form factor photonic transceiver device, the packaged transmitter device 100 can be mounted in a upside-down fashion with the outer surface of the cover member 113 rested on a PCB surface of the photonic transceiver device. The electrical connection port 1144 is connected directly to corresponding connection spots of the PCB for receiving control signals for the transmitter module 130 from one or more control modules mounted on the same PCB.

Additionally shown in FIG. 2A, the cylindrical member 115 of the TEC-TOSA transmitter device 100 is mounted to the assembling part 122 on one end and correspondingly for connecting to a laser output port 415 on another end. In this embodiment, the cylindrical member 115 is configured to be properly adjusted in both X-Y plane, i.e., cross-section plane perpendicular to an axis of the cylindrical member, and Z-space along the axis, so as to properly couple the emitted laser light from the LD chip 1303 through the annual through-hole 124 and the cylindrical member 115 to an optical fiber (not shown) held by the laser output port 415.

Figure 2B:
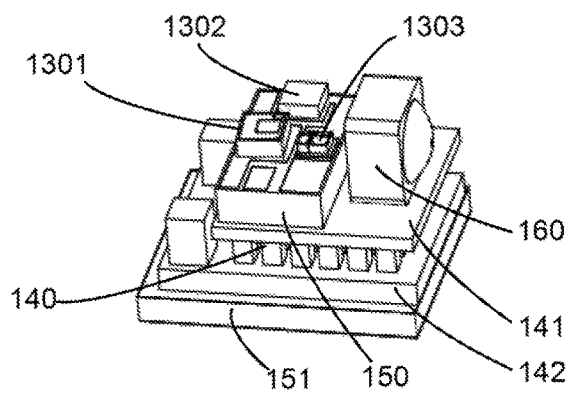
FIG. 2B is a perspective view of an assembly of a transmitter module with a coupling lens mounted on a TEC module in the TEC-TOSA transmitter device of FIG. 2A according to the embodiment of the present invention.

FIG. 2B is a perspective view of an assembly of a transmitter module with a coupling lens mounted on a TEC module in the TEC-TOSA transmitter device of FIG. 2A according to the embodiment of the present invention. As shown, the transmitter module 130 of FIG. 2A mounted on a submount 150 is sharing a same cold side surface 141 of the TEC module 140. The hot side surface 142 is disposed on top of another submount 151 which is attached to the bottom of the semi-hollow region 125 of the planar part 121 of the TEC base member 111. Both the hot side surface 142 and the submount 151 are not visible in FIG. 2A.

Figure 3:
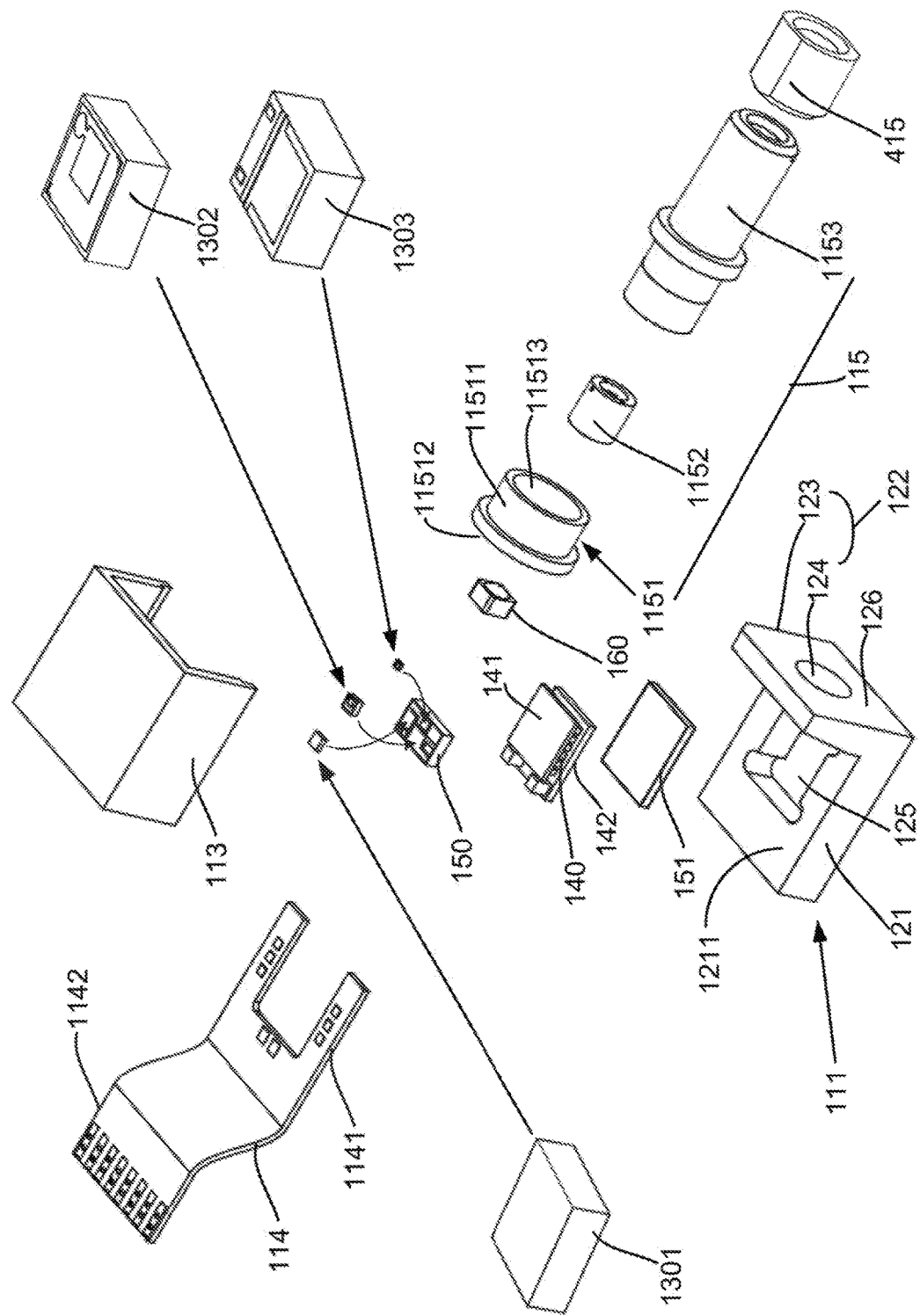
FIG. 3 is an exploded view of the TEC-TOSA transmitter device according to the embodiment of the present invention.

FIG. 3 is an exploded view of the TEC-TOSA transmitter device according to an embodiment of the present invention. This diagram is merely an example, which should not unduly limit the scope of the claims. One of ordinary skill in the art would recognize many variations, alternatives, and modifications. As shown, the cylindrical member 115 of TEC-TOSA transmitter device can be disassembled into a Z-space member 1151 with plane adjusting mechanism, an isolator 1152, a cylindrical receptacle member 1153 with light distance adjusting mechanism together with optical fiber connection mechanism, arranged in order from left to right. The isolator 1152 is assembled in an axial location surrounded mainly by the Z-space member 1151 and at least partially by the cylindrical receptacle member 1153. The optical fiber connection mechanism is configured to connect the cylindrical receptacle member 1153 to a laser output port 415 with a fiber ferrule ring to hold an external optical fiber (not shown in FIG. 3). The components of the transmitter module 130 including the thermistor 1301, the MPD chip 1302, and the LD chip 1303 are, each shown with a separate enlarged view, respectively mounted on the submount 150. The submount 150 is placed on a cold side surface 141 of a TEC module 140. The TEC module 140 comprises a plurality of single-stage thermoelectric units sandwiched by the cold site surface 141 and a hot side surface 142. The hot side surface 142 is attached with another submount 151 disposed at a bottom of a semi-hollow region 125 recessed into the planar part 121 of the TEC base member 111. Such package structure for the TEC module 140 has advantages for efficiently cooling the transmitter module 130 and dissipating heat to the bottom of the TEC base member 111. In a specific embodiment of applying this packaged transmitter device to assembly a small form factor photonic transceiver, the bottom of the TEC base member can be conveniently attached directly to a lid member as an efficient heat sink. Also, FIG. 3 shows the Step-shaped circuit board 114 having a U-shape end with electrical connection patches to be mounted on top surface 1211 of the planar part 121 of the TEC base member 111 and a straight end 1142 with electrical pin stripes for external electrical connection. A cover member 113 is designed to dispose over the planar part 121 next to the vertical portion 123 to cover the transmitter module 130 mounted on the submount 150 on the TEC module 140 as well as the U-shape end 1141 of the circuit board 114.

Figure 4:
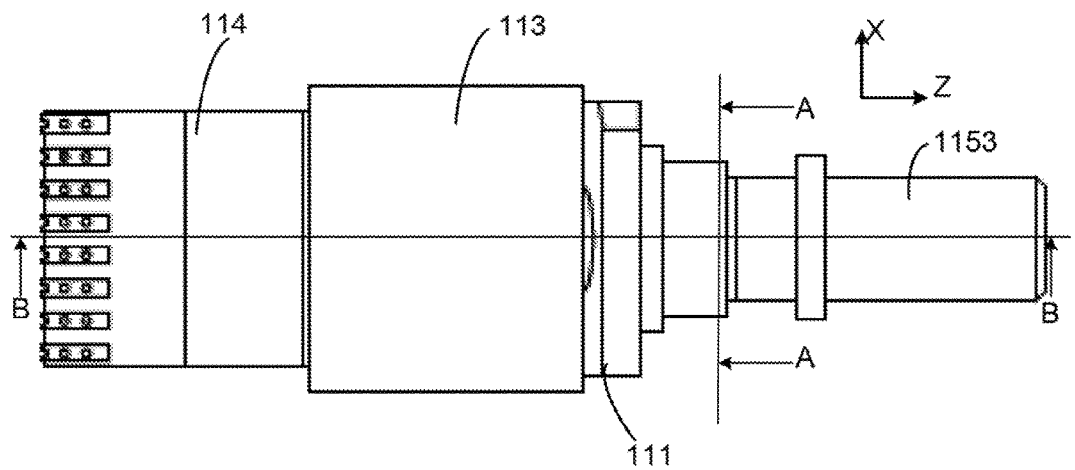
FIG. 4 is a top view of the TEC-TOSA laser device according to an embodiment of the present invention.
Figure 5A:
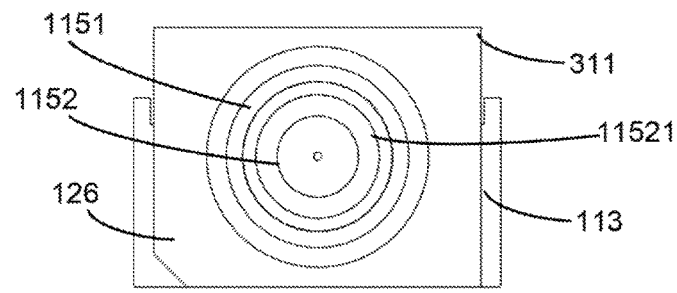
FIG. 5A is a cross-section view of the TEC-TOSA laser device of FIG. 5 along line A-A according to the embodiment of the present invention.

FIG. 4 is a top view of the TEC-TOSA transmitter device according to an embodiment of the present invention. FIG. 5A is a cross-section view of the TEC-TOSA transmitter device of FIG. 4 along line A-A according to the embodiment of the present invention. Please refer to FIG. 1 through FIG. 5A for the illustration of some structural details of the TEC-TOSA transmitter device 100. As shown in FIG. 3 and FIG. 4, the Z-space member 1151 is integrated on the assembling part 122 by welding after a X-Y plane calibration is completed. Any open space between the Z-space member 1151 and the assembling part 122 is sealed by infusing filler. For the X-Y plane calibration, the assembling part 122 of the TEC base 111 comprises a first connection plane 126 disposed at outer side of the vertical portion 123. The Z-space member 1151 comprises a cylindrical body 11511 and a second connection plane 11512 disposed at one side of the cylindrical body 11511. The second connection plane 11512 corresponds to the first connection plane 126. During active alignment calibration, a calibration device is used to adjust the relative X-Y plane position between the Z-space member 1151 and the assembling part 122 to align Z-axis of the cylindrical body 11511 to the axial line of the annular through-hole 124 of the vertical portion 123 of the assembly part 122 which is previously aligned with the optical coupling lens assembly 160 mounted on the submount 150 on the other side of the vertical portion 122. A calibrated X-Y plane position allows the emitted laser light from LD chip 1303 to be optimally coupled via the coupling lens assembly 160 to an axial point in the cylindrical body 11511. As seen below, an isolator 1152 will be disposed at this axial point surrounded by the cylindrical body 11511. After the X-Y plane calibration is done, the first connection plane 126 is fixed on the second connection plane 11512 by laser spot welding.

Figure 5B:
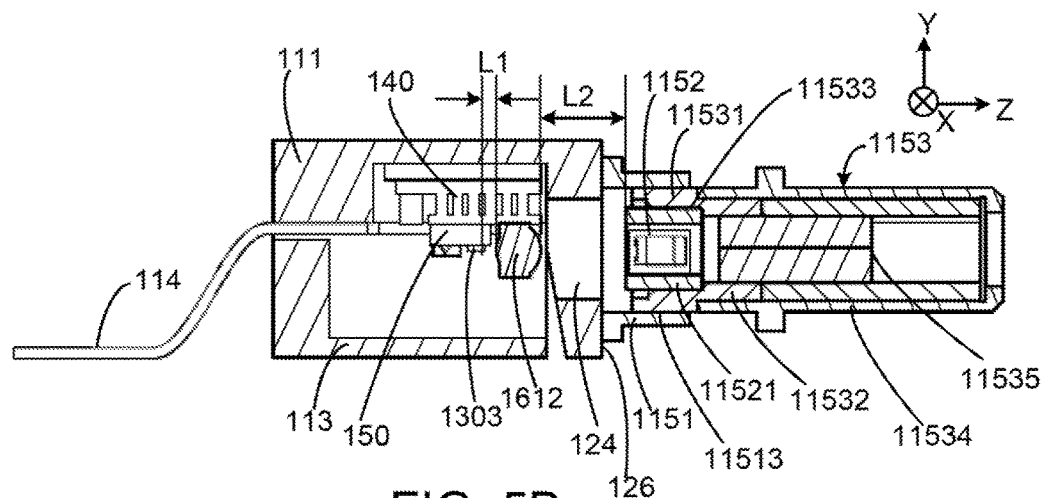
FIG. 5B is a cross-section view of the TEC-TOSA laser device of FIG. 5 along line B-B according to the embodiment of the present invention.

FIG. 5B is a cross-section view of the TEC-TOSA laser device of FIG. 7 along line B-B according to a specific embodiment of the present invention. Referring to both FIG. 3 and FIG. 5B, the cylindrical receptacle member 1153 with the light distance adjusting mechanism is integrated onto the Z-space member 1151 and will be fixed by welding after a Z-axis coupling calibration is completed, and sealed by infusing filler material. For the Z-axis calibration, the Z-space member 1151 includes a groove track (not visible) disposed at a disposal slot 11513 at one side of the cylindrical body 11511 opposing to the second connection plane 11512. The disposal slot 11513 is configured for receiving a coupling portion 11531 of the cylindrical receptacle member 1153 which is movable along the as-mentioned groove track. The coupling portion 11531 further includes an inner disposal slot 11533 for holding the isolator 1152 fixed by epoxy gluing and press fitting. The coupling portion 11531 additionally includes a recessed outer disposal ring 11532 for being hooked by a sleeve body 11534 of the cylindrical receptacle member 1153. After the Z-axis coupling calibration is completed, the coupling portion 11531, which holds the isolator 1152, is fixed to the Z-space member 1151 by laser welding or other welding way. The sleeve body 11534 has one end to engage with the recessed outer disposal ring 11532 of the coupling portion 11531 and an opposite end to receive an optical fiber coupling channel 11535 along the axial position. The optical fiber coupling channel 11535 is configured to couple with a fiber ferrule ring associated with the fiber output port 415 holding the optical fiber to receive the light emitted from the LD chip 1303, coupled by the coupling lens body 1612, and passed through the isolator 1152.

Referring FIG. 3 and FIG. 5B again, the Z-axis coupling calibration is additionally illustrated. The optical coupling lens body 1612 is an aspherical convex lens having a first convex curve surface facing the LD chip and a second convex curve surface facing the isolator 1152. Both curve surfaces are biconvex shaped in general with variable curvatures depending on its distance away from the optical axis. The curvatures of the first convex curve surface are generally much smaller than those of the second convex curve surface. As shown, a distance from the LD chip 1303 to (an apex point of) the first convex curve surface of the coupling lens body 1612 is defined as L1, and a distance from (an apex point of) the second convex curve surface of the coupling lens body 1612 to the isolator 1152 is defined as L2. Because of the curvature arrangement mentioned above, L2 should be larger than L1. In this embodiment, the square metal frame 1611 holding the coupling lens body 1612 is disposed directly on the flat cold side surface 141 of the TEC module 140 in front of the annular through-hole 124 of the assembly part 122 for proper coupling with the LD chip 1303 to get maximum optical output before curing the bonding epoxy to fix the distance L1 between the LD chip 1303 and the coupling lens 1612. But the distance L2 from the coupling lens body 1612 to the isolator 1152 is adjusted according to the light distance adjusting mechanism associated with the cylindrical receptacle member 1153 moving along the groove track of the Z-space member 1151. As L1 is fixed, for better coupling efficiency, length of L2 tends toward a fixed value due to convergence characteristic of the coupling lens 1612. Therefore, the length of L2 depends on the length of L1. For biconvex aspherical lens, such configuration may increase the tolerance between the cylindrical receptacle member 1153 and the Z-space member 1151 since L2>L1, so that difficulty in assembling process can be reduced.

Further in a specific embodiment, the isolator 1152 is disposed in a mechanical body 11521 (FIG. 5A and FIG. 5B). The isolator body 11521 is inserted into the inner disposal slot 11533 of the coupling portion 11531 which is inserted into the disposal slot 11513 of the Z-space member 1151 (see FIG. 5B). The isolator 1152 can be also disposed to connect one side of the external optical fiber, but it is not limited thereto. The optical fiber connection mechanism associated with the cylindrical receptor member 1153 is formed with the light coupling channel 11535 disposed along axial direction holding an optical fiber connected to the isolator 1152. The light coupling channel 11535 is configured to be attached with a fiber ferrule ring associated with the laser output port 415 for holding the optical fiber.

Figure 6A:
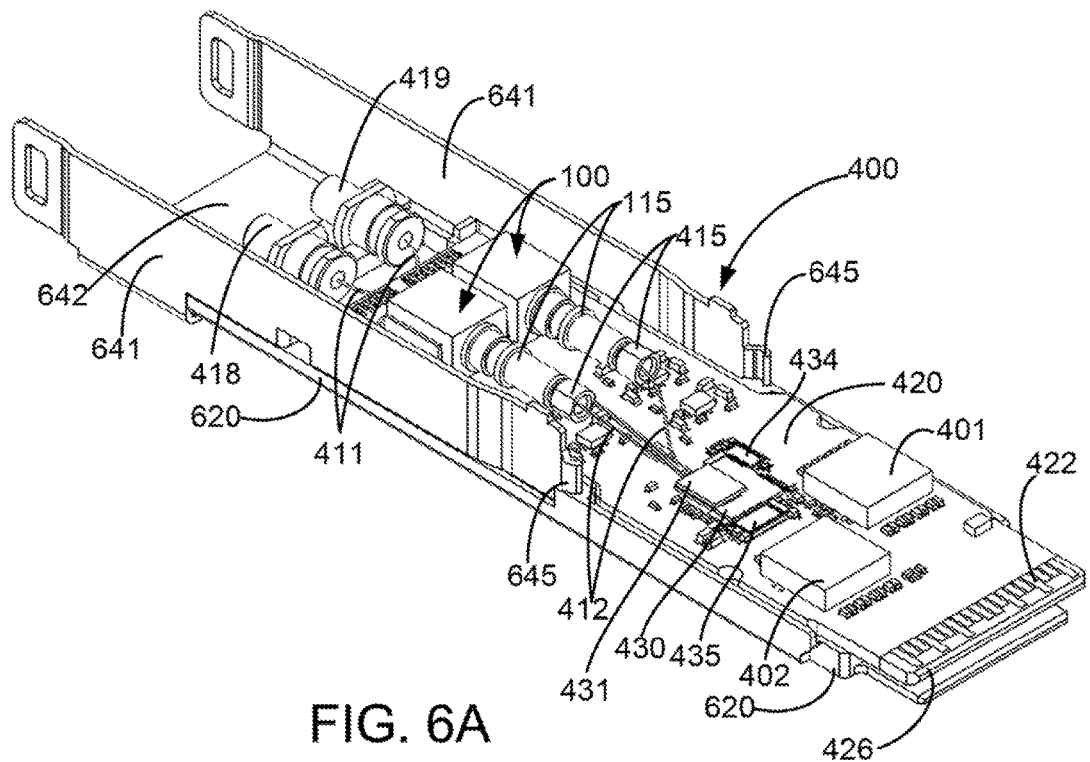
FIG. 6A is a perspective top view of a photonic transceiver package comprising two TEC-TOSA transmitter devices of FIG. 1 without a lid member according to an embodiment of the present invention.

FIG. 6A is a perspective top view of a photonic transceiver comprising two TEC-TOSA transmitter devices of FIG. 1 installed in a partial package structure without a lid member according to an embodiment of the present invention. This diagram is merely an example, which should not unduly limit the scope of the claims. One of ordinary skill in the art would recognize many variations, alternatives, and modifications. As shown, a photonic transceiver 400 includes a pair of TEC-TOSA transmitter devices 100 (of FIG. 1) disposed side-by-side onto a PCB board 420 mounted on a base member 620 of a transceiver package structure. The base member 620 is configured to couple with two vertical pieces 641 of a side member 640. The two vertical pieces 641 are connected by a horizontal joint piece 642 leveled with the base member 620. At a front end region of the photonic transceiver 400 near the horizontal joint piece 642 on the base member 620, two optical ports, one being an optical input port 418 and another being an optical output port 419, are disposed. Each optical port is associated with an optical connector, such as typical LC connector or other suitable connectors used in the industry. Alternatively, a paired multi-fiber push on (MPO) connector can be used for both the input and output ports. The back side of each optical port is coupled to an optical fiber 411 for internal connection of the photonic transceiver 400. The PCB 420 can be disposed at a short distance away from the optical input port 418 and output port 419 and have its back end 426 configured to form an electrical connector with multiple metallic stripes 422.

Referring to FIG. 6A, the pair of TEC-TOSA transmitter devices 100 is mounted on the PCB 220 near the pair of optical ports 418 and 419 at the front end of the transceiver package structure. In a specific embodiment, each TEC-TOSA transmitter device 100 is mounted in a upside-down fashion with its cover member (113 of FIG. 1) facing down in contact with the PCB 420 while leaving its TEC-base member (111 of FIG. 1) facing up to be in contact with a lid member (see FIG. 6B below) of the transceiver package structure. In an alternative embodiment, each TEC-TOSA transmitter device 100 is installed with its laser output port 415 orientated in opposite direction of the optical input/output ports 418 and 419 so that a fiber 412 out of each laser output port is directing towards the back end of the transceiver package structure. The fibers 411 connected to back ends of the optical ports 418/419 are laid between the pair of TEC-TOSA transmitter device 100 to join and bundle with the fibers 412. Then, both fibers 412 and fibers 411 are coupled to a silicon photonics flip-chip 430 via a fiber-to-silicon attachment 431. The silicon photonics flip-chip 430 is mounted in the middle region of the PCB 420.

In a specific embodiment, the silicon photonics chip 430 includes a driver module 434 and a TIA (trans-impedance amplifier) module 435 based on advanced CMOS or SiGe technologies for processing electrical/optical signals associated with the photonic transceiver 400. Furthermore, two CDR ASIC chips 401 and 402 are mounted on the PCB 420 near the back end 426 to control electrical interface for communication with network system. Multiple metallic pin stripes 422 are disposed at the back end 426 of the PCB 420 for plugging the whole photonic transceiver package into a network system.

Figure 6B:
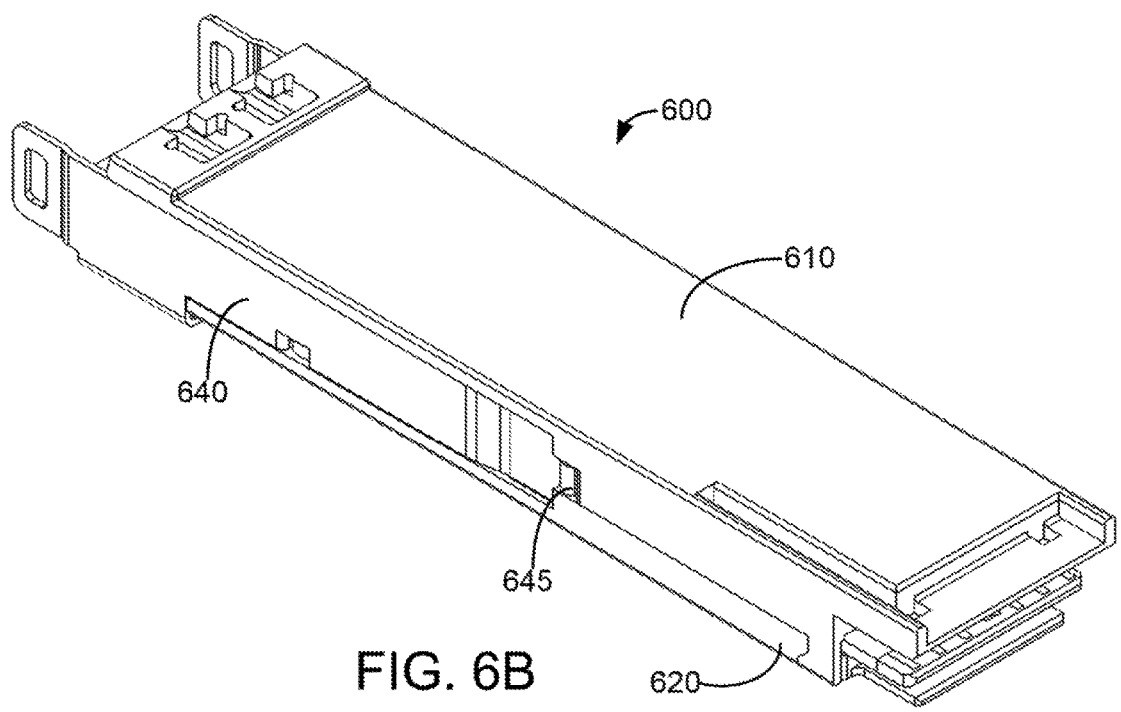
FIG. 6B is a perspective top view of a packaged photonic transceiver in QSFP specification according to an embodiment of the present invention.

FIG. 6B is a perspective top view of a packaged photonic transceiver in QSFP specification according to an embodiment of the present invention. This diagram is merely an example, which should not unduly limit the scope of the claims. One of ordinary skill in the art would recognize many variations, alternatives, and modifications. The handle part has been removed from the package structure. In an embodiment, a lid member 610 is disposed to couple with both the side member 640 and the base member 620 to form the packaged photonic transceiver 600. Specifically, the lid member 610 includes a top piece connected to a pair of partial side pieces to couple with the base member 620 to provide a space volume that holds the photonic transceiver 400 therein, which is revealed in FIG. 6A, while leaving an opening at a back end of the base member 620 to allow the electrical connector of the photonic transceiver 400 for plugging in to communication system. The packaged photonic transceiver 600 is compatible with the Quad Small Form-factor Pluggable (QSFP) specification, which is designed for a compact small form factor, hot-pluggable photonic transceiver package used for high speed data communications applications. Technically, the small form factor pluggable transceiver allows data rates of 4×10 Gbit/s, 4×28 Gbit/s or higher.

In yet another specific embodiment, the packaged photonic transceiver 600 in this embodiment applies technology of wavelength-division multiplexing (WDM), two or more TEC-TOSA transmitter devices to use a DFB laser diode to generate laser light of different wavelengths at any channels of dense-wavelength-division-multiplexing spectrum band. Two channels can further be combined into one single-mode optical fiber via wavelength-division multiplexer for middle distance and long distance transmission. Next, the received optical signal is performed a light-split process by the demultiplexer and the split optical signals are introduced to different channels. In this embodiment, except WDM technology, the photonic transceiver package 100 also can be applied to related optical communication technologies, such as binary phase shift keying modulation (BPSK), quadrature phase shift keying modulation (QPSK), conventional/coarse wavelength division multiplexing (CWDM), dense wavelength division multiplexing (DWDM), and optical add/drop multiplexer (OADM), reconfigurable optical add/drop multiplexer (ROADM).

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method of packaging a photonic transceiver comprising:
providing a base member comprising a planar part extended to an assembling part;
mounting a thermoelectric cooler module, a transmitter module, and an optical coupling lens assembly on a top surface of the planar part;
disposing a circuit board bended in step-shape with a first end region sitting on a top surface of the planar part and a second end region being a raised level, the first end region comprising multiple electrical connection patches respectively connected to the thermoelectric module and the transmitter module, the second end region comprising an electrical port for external connection;
disposing a cover member to a fixed position over the planar part to at least cover the thermoelectric module, the transmitter module, the optical coupling lens assembly, and the first end region of the circuit board;
assembling a cylindrical member to the assembling part, the cylindrical member enclosing an isolator aligned to the optical coupling lens assembly along its axial line and connected to a first optical fiber to output optical signal from the transmitter module; and
mounting the base member on a PCB board.

2. The method of claim 1 wherein the mounting the thermoelectric cooler module comprises disposing a plurality of single-stage thermoelectric units sandwiched between a hot side surface and a cold side surface;
attaching the hot side surface to a first submount inside a semi-hollow region recessed from the top surface of the planar part; and
attaching the cold side surface partially with a second submount.

3. The method of claim 2 wherein the mounting the transmitter module comprises mounting a thermistor chip, a monitor photodiode chip, and a laser diode chip respectively on the second submount.

4. The photonic transceiver of claim 2 wherein the mounting the optical coupling lens assembly comprises holding an aspherical lens with a square metal frame; directly mounting the square metal frame that holds the aspherical lens on the cold side surface between the second submount and the assembly part.

5. The method of claim 4 wherein the holding the aspherical lens comprises configuring the aspherical lens with a first convex curve surface having a first plurality of curvatures at different surface locations relative to its central axis and a second convex curve surface having a second plurality of curvatures at different surface locations relative to its central axis, each of the first plurality of curvatures being smaller than each of the second plurality of curvatures.

6. The method of claim 5 wherein the holding the aspherical lens further comprises disposing a first apex point of the first convex curve surface at a first distance away from the laser diode chip and a second apex point of the second convex curve surface at a second distance away from the isolator.

7. The method of claim 6 wherein the first distance is fixed at 0.25 mm with 0.8 mm tolerance and the second distance is adjustable within a range from 1.5 mm to 4.0 mm for achieving a coupling efficiency of at least 50%.

8. The method of claim 1, wherein the assembly part comprises a vertical portion attached to a side of the planar part above the top surface, the vertical portion having a connection plane distal to the planar part and an annular through-hole positioned near a center position of the vertical portion to allow the emitted light from the transmitter module coupled via the optical coupling lens assembly to pass into the cylindrical member.

9. The method of claim 8 wherein the assembling a cylindrical member comprises attaching a first cylindrical body with a plane adjusting mechanism to the connection plane; attaching one end of a second cylindrical body with a light distance adjusting mechanism to the first cylindrical body while leaving another end of the second cylindrical body with an optical fiber connection mechanism for connecting a fiber.

10. The method of claim 9 wherein the assembling a cylindrical member further comprises fixing the isolator to a coupling portion of the second cylindrical body; enclosing the isolator in a disposal slot of the first cylindrical body; using the plane adjusting mechanism to adjust the first cylindrical body against the connection plane to calibrate X-Y plane positions relative to the light out of the optical coupling lens assembly; and using the light distance adjusting mechanism to adjust the second cylindrical body against the first cylindrical body to calibrate a Z-axis position from the optical coupling lens assembly.

11. The method of claim 10 wherein the assembling a cylindrical member further comprising engaging one end of a sleeve body to an outer disposal ring of the coupling portion and using another end of the sleeve body to receive an optical fiber coupling channel for holding the first optical fiber.

12. The method of claim 1 wherein the disposing the circuit board comprises configuring a middle region in certain angles respectively connected to both the first end region being flat on the top surface of the planar part and the second end region being flat at the raised level substantially in parallel with the first end region, the second end region being extended outside of the cover member and the base member.

13. The method of claim 12 wherein the first end region comprises a U-shape end to hold the multiple electrical connection patches.

14. The method of claim 1 further comprising:
disposing an optical input port and an optical output port on a first end of the PCB board having a second end configured with multiple metallic stripes as an electrical connector pluggable to a network system;
plugging a silicon photonics chip onto the PCB board, wherein the silicon photonics chip is configured to couple with the transmitter module via the first optical fiber and connect with inner terminals of the optical input port and the optical output port respectively via a second optical fiber and a third optical fiber; and
mounting a fiber holder on the PCB board, wherein the fiber holder holds at least the first, second, and third optical fibers.

15. The method of claim 14 further comprising disposing the PCB board into a case comprising a base piece, a side piece with two vertical parts connected by a horizontal joint part, and a lid piece with a top part connected to a pair of partial-side parts; wherein the base piece is configured to couple with the two vertical parts of the side piece and the horizontal joint part leveled with the base piece, the lid piece is configured to couple with the base piece with the pair of partial-side parts joined with the two vertical parts.

16. The method of claim 15 wherein the case comprises a front end near the horizontal joint part with a first opening configured as outer terminals of the optical input port and the optical output port at the first end of the PCB board for connecting with external optical fibers, and a back end near the second end of the PCB board with a second opening configured as a window for the electrical connector pluggable to the network system.

17. The method of claim 16 wherein the case comprises dimensions compatible with Quad Small Form-factor Pluggable specification.

18. The method of claim 15, further comprising repeating steps of claim 1 for adding a second unit on the PCB board, the second unit including a fourth optical fiber connected to the silicon photonics chip for providing a second wavelength channel of the photonic transceiver; and disposing the PCB board into the case.

19. The method of claim 14 wherein the silicon photonics chip comprises a photonics substrate holding a driver module, a trans-impedance amplifier module, and a fiber-to-silicon attachment for coupling the first, second, and third optical fibers to the photonics substrate.

20. The method of claim 19 wherein the disposing an optical input port and an optical output port and mounting the fiber holder on the PCB board comprise laying a direction of the first output fiber out of the transmitter module toward opposite direction of the optical input port and the optical output port.

* * * * *